(12) United States Patent
Zhao et al.

(10) Patent No.: US 7,474,001 B2
(45) Date of Patent: Jan. 6, 2009

(54) METHOD FOR IN-LINE MONITORING OF VIA/CONTACT HOLES ETCH PROCESS BASED ON TEST STRUCTURES IN SEMICONDUCTOR WAFER MANUFACTURING

(75) Inventors: Yan Zhao, San Jose, CA (US);
Chang-Chun Yeh, Miaoli (TW);
Zhong-Wei Chen, San Jose, CA (US);
Jack Jau, Los Altos, CA (US)

(73) Assignee: Hermes-Microvision, Inc., San Jose, CA (US)

( * ) Notice: Subject to any disclaimer, the term of this patent is extended or adjusted under 35 U.S.C. 154(b) by 156 days.

(21) Appl. No.: 11/452,544

(22) Filed: Jun. 13, 2006

(65) Prior Publication Data

US 2006/0234496 A1   Oct. 19, 2006

Related U.S. Application Data

(60) Division of application No. 10/865,230, filed on Jun. 9, 2004, now Pat. No. 7,105,436, which is a continuation of application No. 10/302,809, filed on Nov. 21, 2002, now Pat. No. 6,815,345.

(60) Provisional application No. 60/332,016, filed on Nov. 21, 2001.

(51) Int. Cl.
*H01L 21/31* (2006.01)
*H01L 21/469* (2006.01)

(52) U.S. Cl. .................. 257/758; 257/750; 438/622

(58) Field of Classification Search ............. 257/750, 257/758, 760; 438/622, 637, 638, 639, 641
See application file for complete search history.

(56) References Cited

U.S. PATENT DOCUMENTS

| 6,716,642    | B1 * | 4/2004 | Wu et al. ............... 436/518 |
| 2002/0094533 | A1 * | 7/2002 | Hess et al. .............. 435/6   |

* cited by examiner

*Primary Examiner*—Phuc T Dang
(74) *Attorney, Agent, or Firm*—Townsend and Townsend and Crew LLP

(57) ABSTRACT

A method for in-line monitoring of via/contact etching process based on a test structure is described. The test structure is comprised of via/contact holes of different sizes and densities in a layout such that, for a certain process, the microloading or RIE lag induced non-uniform etch rate produce under-etch in some regions and over-etch in others. A scanning electron microscope is used to distinguish these etching differences in voltage contrast images. Image processing and simple calibration convert these voltage contrast images into a "fingerprint" image characterizing the etching process in terms of thickness over-etched or under-etched. Tolerance of shifting or deformation of this image can be set for validating the process uniformity. This image can also be used as a measure to monitor long-term process parameter shifting, as well as wafer-to-wafer or lot-to-lot variations. Advanced process control (APC) can be performed in-line with the guidance of this image so that potential electrical defects are avoided and process yield ramp accelerated.

5 Claims, 5 Drawing Sheets

METHOD FOR IN-LINE MONITORING OF VIA/CONTACT HOLES ETCH PROCESS BASED ON TEST STRUCTURES IN SEMICONDUCTOR WAFER MANUFACTURING

CROSS REFERENCE TO RELATED APPLICATIONS

This application is a division of U.S. application Ser. No. 10/865,230, filed Jun. 9, 2004 now U.S. Pat. No. 7,105,436, which is a continuation of U.S. application Ser. No. 10/302,809, filed Nov. 21, 2002 now U.S. Pat. No. 6,815,345, claiming priority to U.S. Provisional Application No. 60/332,016, filed Nov. 21, 2001. These applications are incorporated by reference herein for all purposes.

U.S. application Ser. No. 10/302,809 is related to U.S. Provisional Application entitled "A Method for In-Line Monitoring Of Via/Contact Etching Process Uniformity In Semiconductor Wafer Manufacturing," Application No. 60/329,917, filed Oct. 16, 2001. The prior application is hereby incorporated hereinto by reference.

BACKGROUND OF THE INVENTION

1. Field of the Invention

This invention relates generally to in-line monitoring of via/contact etching process in semiconductor device fabrication by using a scanning electron microscope (SEM), and more particularly to methods and devices for determining whether via/contact holes are over or under etched in the process of fabricating a semiconductor device.

2. Description of the Prior Art

Very large-scale integrated (VLSI) circuits rely on via/contact holes (as well as trenches) for electrically interconnecting devices of different layers, interconnecting a layer to an underlying substrate, or interconnecting a layer to another layer. The electrical defects associated with the deep (high aspect ratio) sub-micron via/contact holes takes up a significant parts of the total yield loss as the current technology approaches to the 0.1 µm node. It is, therefore, essential to ensure that the etching process for creating such via/contact holes are optimized and in-line controlled within the process window, so that the potential via/contact failure due to either process parameters shifting or wafer-to-wafer dielectric thickness variation can be identified and avoided in the early steps.

Because of the nonuniformity in the etch rate, and the fact that the film itself may be of nonuniform thickness across the wafer or from wafer to wafer, a certain amount of over-etching is done to ensure that complete etching is achieved everywhere on the wafer, and appropriate electrical contact is obtained. This is often 10-20% over-etching in terms of time past the endpoint point. Even more over-etching (as much as 50%) may be required when anisotropic processing is done over non-planar topography. However, as the technology shrinks into the 0.10 µm mode, the thickness of over-etch margins have dropped drastically. Excessive over-etch of contact holes will cause the thin metal silicide layer on top of a drain/source region to be diminished due to the limited selectivity of the etch process. Also important, there is high probability that the contact penetrates the shallow pn-junction beneath the drain/source that leads to high leakage current. For via etch processes aiming at open dielectric barriers over the lower metal level, it is also necessary to avoid excessive dielectric barrier over-etch; otherwise, copper is exposed and sputtered during the over-etch step, potentially compromising device reliability.

The integrity of via/contacts can be validated by measuring the resistance of long chains connecting thousands of vias/contacts in series with each other and located in the scribe lines or in test chips on the wafer. These via/contact chains pass over various topographies. A current is forced through these long chains, and the measured voltage is a measure of the average contact resistance. These structures are used to monitor the via/contact as a function al processing conditions and structures, and to measure lot-to-lot variation. A high value of resistance in these structures could indicate a problem with under-etch, over-etch, and/or etch residue, but may also be causes of poor metal deposition, voids in contact region, or other problems incurred in subsequent processes. In addition, this test cannot be performed before completion of the conductive wiring chain. This increases the manufacturing cost.

An electron beam inspection system, or in its simplest form, a conventional scanning electron microscope (SEM), has been proven to be a powerful tool for imaging electrical defects such as via/contact short. As the primary electron beam scans over the inspection area, low energy secondary electrons (SE) (~5 eV) will be generated from the surface and collected by the SE detector to form an image. Due to the differences in SE yields of the involved materials or the abnormal electrical conductivity of the defect portions, the inspected surface will be unevenly charged positively and/or negatively. Negatively charged surfaces tends to produce more SE to the signal detector, thus its appearance is relatively brighter, while a positively charged surface attracts more SE and thus appears relatively darker. This is the so-called voltage contrast (VC). VC can be used roughly to divide via/contact holes into the categories of under-etch or over-etch. However, it lacks the sensitivity to the level of under-etch or over-etch, thus is not suitable for process monitoring.

SUMMARY OF THE INVENTION

An objective of this invention, therefore, is to provide a method and test structures to monitor the via/contact etching uniformity over a dielectric layer of a wafer.

Another objective of this invention is to provide a method and test structures to monitor the process variation due to etching parameters shifting and/or dielectric layer thickness variation from wafer-to-wafer or lot-to-lot.

A further objective of the present invention is to provide a method and test structures to estimate the amount of over-etch or under-etch in the actual device region with respect to the just-etch.

In accordance with the above-described objects and those that will be mentioned and will become apparent below, a test structure for monitoring the via/contact holes includes the provision of via/contact holes of different sizes and densities formed into a dielectric layer for making contact to the buried conductive layer or active regions such as source/drain. The thickness of the dielectric layer as well as its topography resembles that required in the functional dies for making actual devices. FIG. 1 depicts one of such layout as an array with density varying along columns 101 and hole size varying along rows 102. The test structures may be placed on the semiconductor wafers as "drop-ins," which are located where functional dies would normally be placed. Or they can be placed in wafer scribe lines, which are lines between functional dies defining diamond saw cuts that separate finished devices. The via/contact holes in the test structure, formed simultaneously with those in the functional die, will be etched to different levels as the result of the microloading effect or RIE "lag". With reference to the related patent application referenced above, voltage contrast of these holes will reverse at certain beam conditions from bright to dark if the thickness of under-etch remains over a threshold value at a certain primary beam energy and current, as shown in FIG. 2. Curve 201 depicts the SE signals (normalized to background signal) originating from the via/contact hole bottom as a function of thickness of remains or recesses with respect to just-etch. Point 202 corresponds to the threshold thickness across which the contrast of the hole reverses. If the test structure is properly designed in such a way that the etching variations inside the hole ranges from under-etch to excessive over-etch, for instance, from −150 Å (over-etch) to 100 Å (under-etch), the VC contrast of these holes will experience a transition from bright to dark. For the test structure in FIG. 1, the corresponding VC image may have a similar appearance as shown in FIG. 3. Via/contact holes at the lower-right corner are of smaller sizes and relatively higher densities, thus turn up brighter due to the relatively slow etching rate associated with microloading effects, while for those at the upper-left corner having relatively larger holes and lower density, turn out to be darker as over-etching commonly happens. There is a narrow transition region lying between the upper-left and lower-right corners, at which image signals are so sensitive to the actual remains that holes may appear white or dark, depends on the randomly thickness variation.

The foregoing VC transition image characterizes the etching process as its size and location should are generally fixed for a given process. Proper image processing, for instance, by subtracting two similar images of the adjacent test structures, may highlight the VC transition portion in the resulting image. This resulting image can be regarded as a "fingerprint" image of a specific etching process. Shifting or change of this fingerprint image may happen over different parts of a wafer, or from wafer-to-wafer and lot-to-lot. The former implies the occurrence of non-uniform etching because of the process itself, or uneven dielectric thickness over the wafer; caution must be paid if the shifting exceeds the predetermined tolerance. The latter is due to long term process parameter shifting; manual or automatic process adjustment is necessary to keep it within the tolerance region.

According to the related patent application referenced above, at a given primary beam energy and current, the VC transition happens at a certain under-etch level of around a certain thickness. In fact, the VC transition region can be treated as a curve of equi-thickness of under-etch, usually on the order of several tens of angstroms. Its conformal curves may be used to characterize the etching similarity in terms of the thickness of under-etch or over-etch. Calibration can be made further to quantize these equi-etching lines with respect to the just-etch.

FIG. 4 shows an example of the calibrated equi-thickness curves over the process "fingerprint" image. For a given via/contact design in the functional die region, it is always possible to locate its position in this quantized fingerprint image and check out its corresponding amount of over-etch thickness. System fine tuning or APC can be made to control the percentage of over-etch time so that the amount of over-etch is tightly controlled not far away from just-etch, for instance, 50 Å. By doing so, the presently required over-etch time when etching contact holes can be reduced considerably by 10%.

IN THE DRAWING

The invention may be understood by reference to the following description taken in conjunction with the accompanying drawings, in which like reference numerals identify like elements, and in which.

DETAILED DESCRIPTION OF THE PREFERRED EMBODIMENTS

Figure 1:
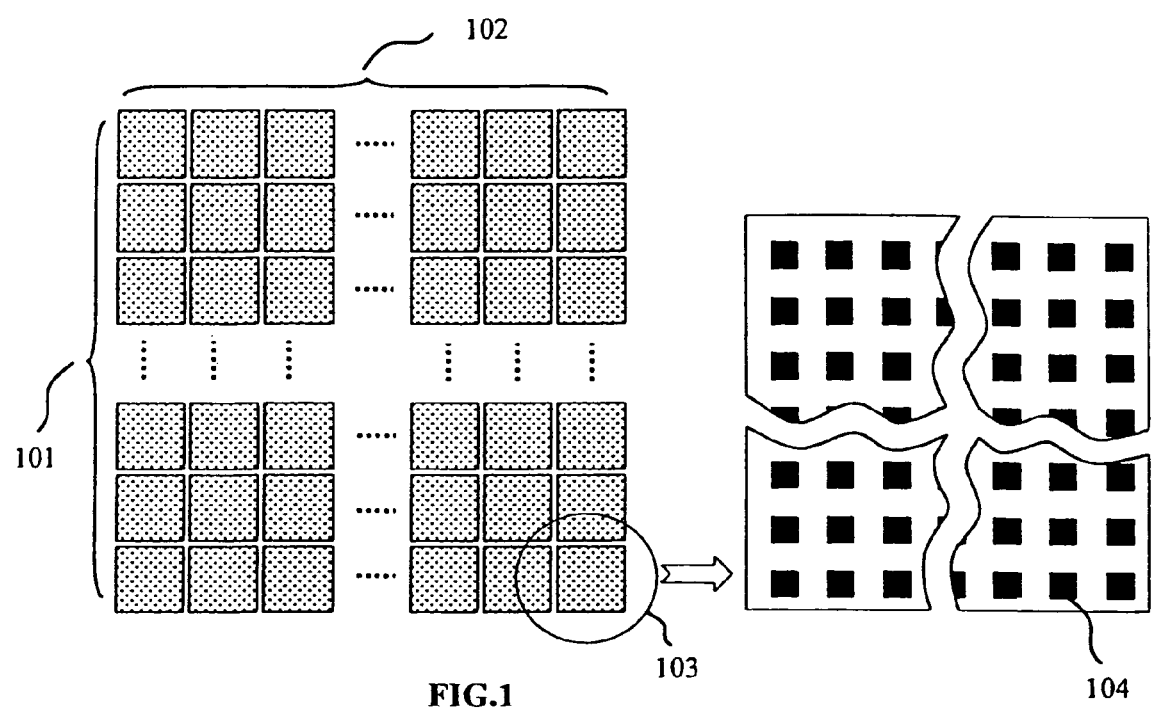
FIG. 1 is an illustrative layout of the test structure and consists of arrays of via/contact holes of different sizes and densities.

FIG. 1 depicts an embodiment of a via/contact test structure consisting of arrays 103 with increasing via/contact size along the row 101 direction and increasing densities or pattern factor (exposed Si area/wafer area) along the column 102 direction. Each via/contact array consists via/contact holes of a single size and density (pattern factor), as 104 indicates, and is etched simultaneously with the via/contacts in the functional dies into a dielectric layer of similar thickness and topography for making contact to the buried conductive layer or active regions such as source/drain. The aim of the embodiment is to have the etching process impose different etch rates, as the result of the microloading effect, and/or RIE lag, over the variant holes and to get uneven etch over the structure range from under-etch to over-etch. Other forms or modifications and/or embodiments may also meet this purpose and are thus intended to be covered by this disclosure. The embodiment of such test structure involves numerous implementation-specific decisions for achieving the ultimate goal, such as compliance with litho-related constraints. It is necessary to ensure that the smallest size of via/contact, usually 10% below the design size in the functional dies, is within the exposure process window, so that no significant litho-induced size variation is transfered to the etching step. The test structures may be placed on the semiconductor wafers as "drop-ins," which are located where functional dies would normally be placed. Or they could be placed in wafer scribe lines, which are lines between functional dies defining diamond saw cuts that separate finished devices, The foregoing description disclosed the test structure and the anticipated etching results. Further embodiments of this invention rely on voltage contrast imaging of this test structure with a SEM, or the like, apparatus. According to the related patent application referenced above, under and/or over etch via/contact holes will appear differently in contrast in a SEM image due to their voltage differences induced by primary electron beam irradiation. In general, primary electron irradiation will cause the surface to be positively charged or negatively charged depending on the total electron yield associated with the material as well as the immediate field conditions, such as extraction and retarding fields. The sustained positively charges tend to attract the consequent SE back to the surface, thus the corresponding features appears relatively dark while the negative charged surfaces repulse the SE so that the features appear relatively bright. The detected SE signal is a function of the surface charging voltages, or equivalently in the contact case, the remaining $SiO_2$ thickness.

Figure 2:
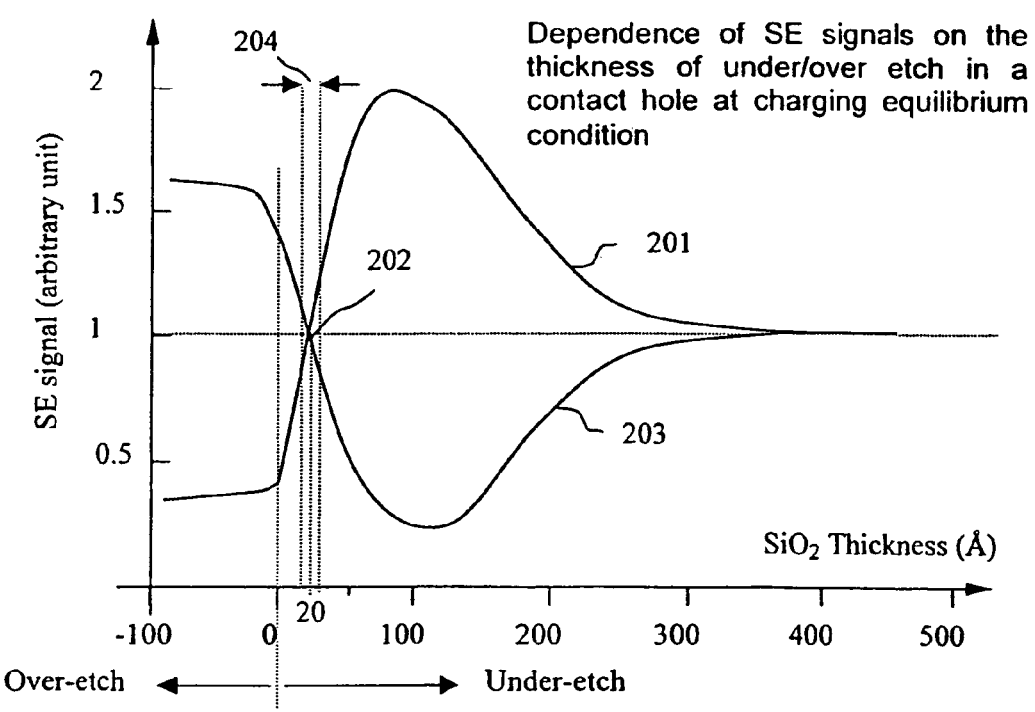
FIG. 2 illustrates the detected SE signals from a via/contact hole bottom normalized with the background signal as a function of thickness of under-etch and/or over-etch.

FIG. 2 illustrates the detected SE signals as a function of the thickness of under-etch (positive thickness) and/or over-etch (negative thickness). The signals are normalized with background level taken from the top surface, thus values higher than one equivalent to a bright image and those lower than one equivalent to a bright image. These curves are obtained at a charge equilibrium condition at which the overall voltage contrast is stable. Curve 201 corresponds to the case where the substrate pn junction is equivalently forward-biased, as the compound effects of an external field associated with the electron optical system and local charge induced field associated with the high aspect ratio hole. For instance, for a p-type substrate with n-type source/drain under a weak enough extraction field, the contact hole acts as a Faraday cup and traps SE within the sidewall and bottom. The locally charged induced field predominates and imposes forward bias on the pn-junction. Negative charges on the contact bottom will not sustain as they always find their way to release through the low resistant pn-junction. As the result, under-etch appears bright and over etch appears dark. However, this voltage contrast image is reversible if the external extraction field is strong enough to overwhelm the local charge induced field. Once the effectively biased field for the pn-junction becomes reversed, the relatively high resistance pn-junction prevents the negative charges on the contact bottom from releasing, thus the through contact appears bright. For under-etch contacts with slight remainder, some electrons among the generated electron-hole pairs in the substrate may penetrate the thin $SiO_2$ barrier to the bottom surface by the tunneling effect, the detected SE signal decreases exponentially with the increasing $SiO_2$ thickness. As the thickness further increases, the probability for the generated SE to escape the holes increases as the aspect ratio decreases. The SE signal in the reverse-biased case is depicted by curve 203.

It mat be noticed from FIG. 2 that there is a threshold thickness beyond which via/contact appearance will transit from one contrast to its opposite. The sharp slope across the threshold point 202 implies that the VC image can be very sensitive to the actual thickness of remainders. Slight variation of under-etching remainders around the threshold value may result in a significant difference in contrast or size. Experiment has confirmed this predication and proper tuning of the primary electron beam energy to 200 eV and current to 75 nA will shift the threshold thickness to the order of several tens of angstrom. This reduced threshold thickness provides a valuable measure for monitoring the etching process towards the just-etch or minor over-etches. The design of the test structure aims to produce such kind of etching level and covering from −150 Å over-etch to 100 Å under-etch.

Figure 3:
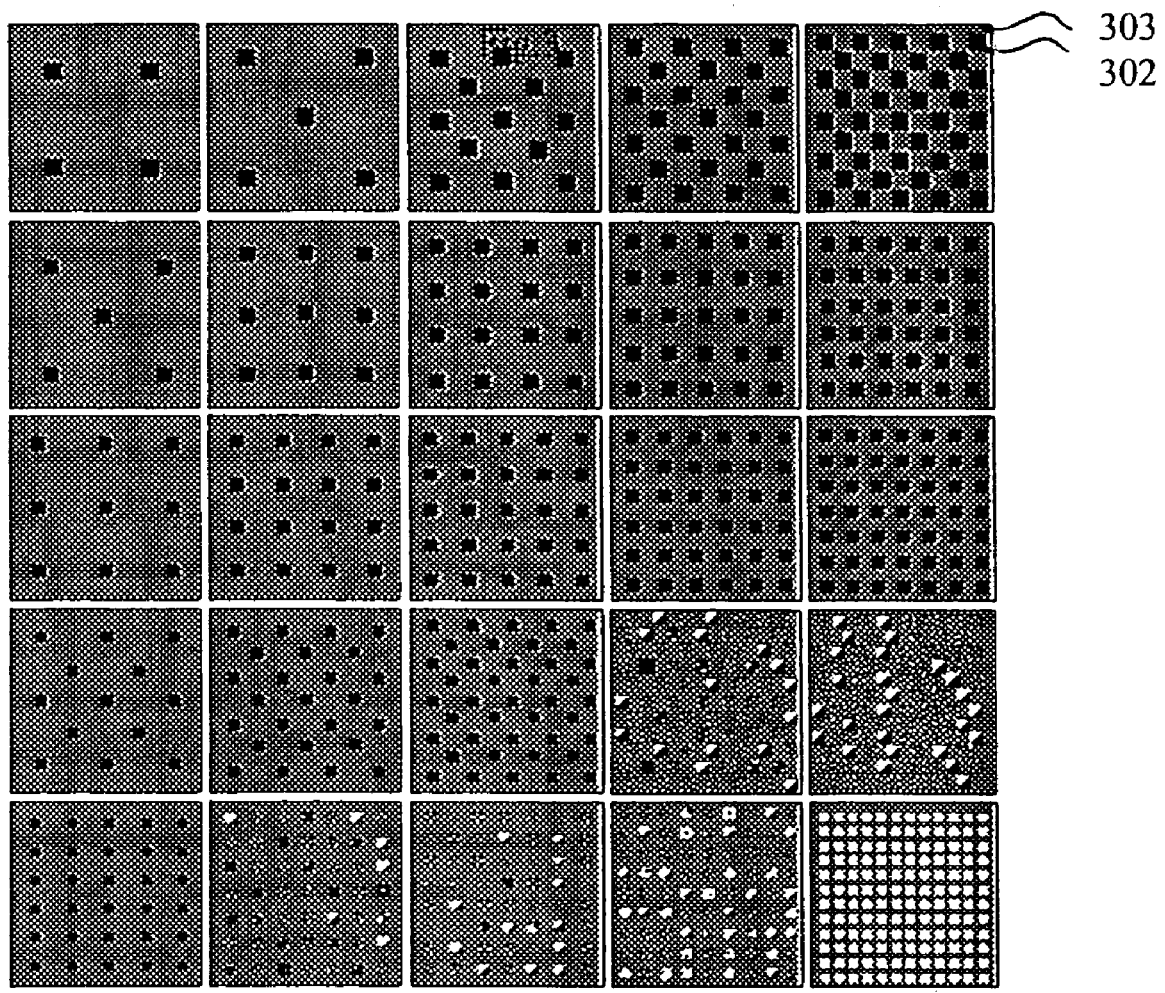
FIG. 3 shows the voltage contrast image of the test structure under certain beam conditions, and demonstrates the transition of via/contact contrast due to uneven etching ranging from under-etch to over-etch.
Figure 4:
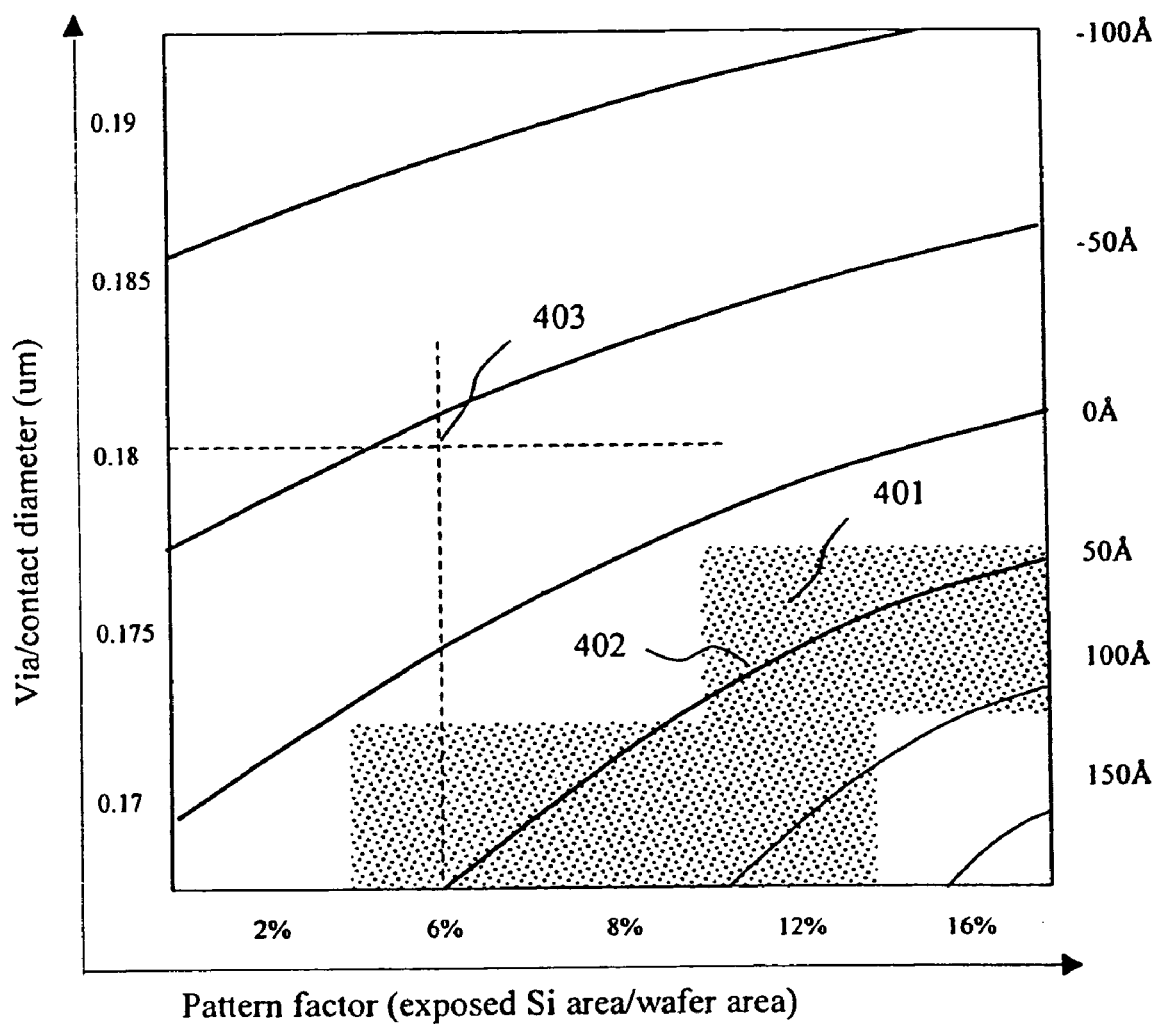
FIG. 4 depicts the fingerprint image of the test structure and the overlapped equi-thickness lines of under-etch and/or over-etch.

FIG. 3 illustrates the VC image of the test structure. Via/contact holes at the lower-right corner are etched at a relatively slow etching rate and stop at under-etch with relatively more remainders, while via holes 302 at the upper-left corner 303 are of relatively larger hole size and lower density; so that it results in excess etch ending inside the silicon substrate. As a result, the former is associated with bright holes while the latter is associated with dark ones. In between the upper-left and lower-right corners, a narrow transition region exists in which the holes turn out to be either bright or dark and merely depends on the unavoidable random thickness variation in an etching process. For a given primary beam energy and current, this transition region characterizes the etching process by its relative size and location in the VC image of the test structure as it is generally fixed for a given process. Proper image processing, for instance by subtracting two similar images of the adjacent test structures, may highlight the transition portion in the resulting image, as shown in FIG. 4 by the shadow region 401. This resulting image is also called process an ID map, or process "fingerprint". Shifts and/or changes of this fingerprint may happen over different parts of a wafer, or from wafer (lot)-to-wafer (lot). The former implies the occurrence of non-uniform etching because the process itself mismatches the specs, or uneven dielectric thickness over the wafer; caution must be taken if the shifting exceeds the predetermined tolerance. The latter can be attributed to long-term process parameter shifting; manual or automatic process adjustment is necessary to keep it within the tolerance region.

Figure 5A:
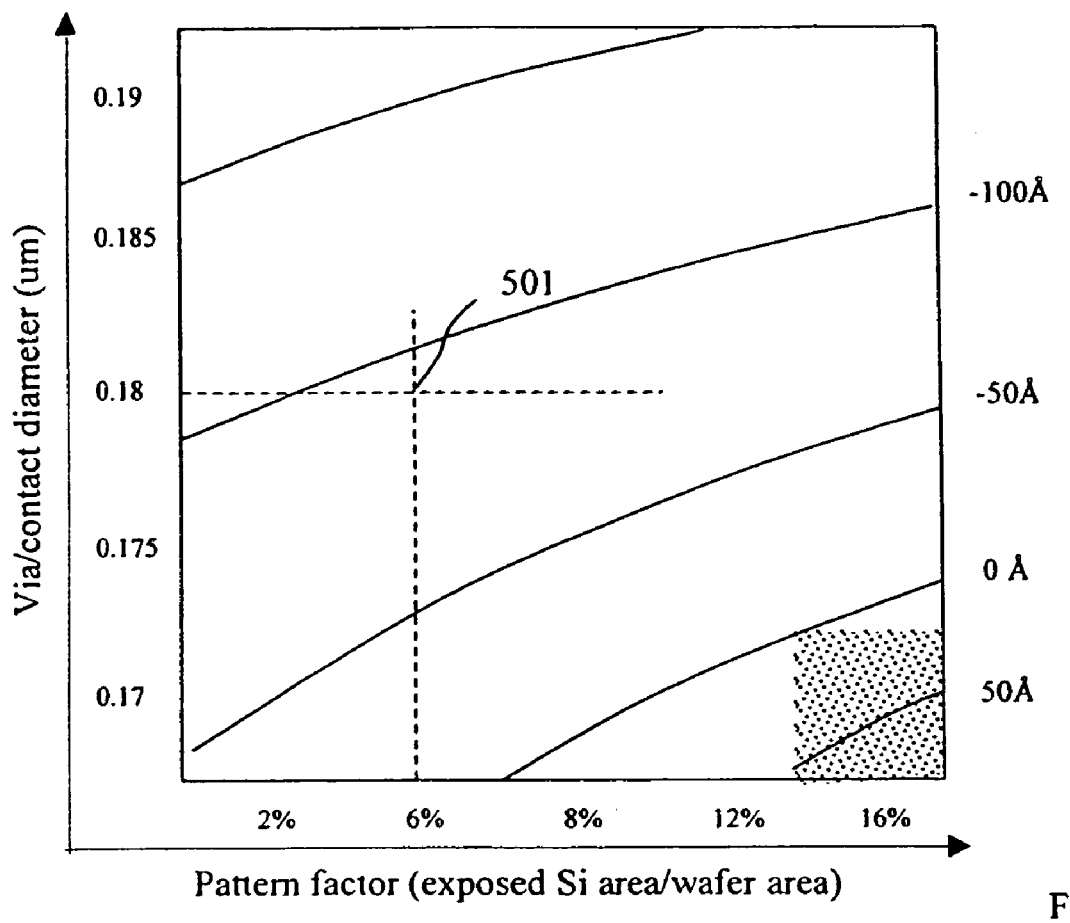
FIGS. 5A and 5B illustrate the shifting of fingerprint images towards excessive over-etch and under-etch, due to either etching parameters shifting or wafer-to-wafer variation, and its implications on the via/contact quality in the functional die region.
Figure 5B:
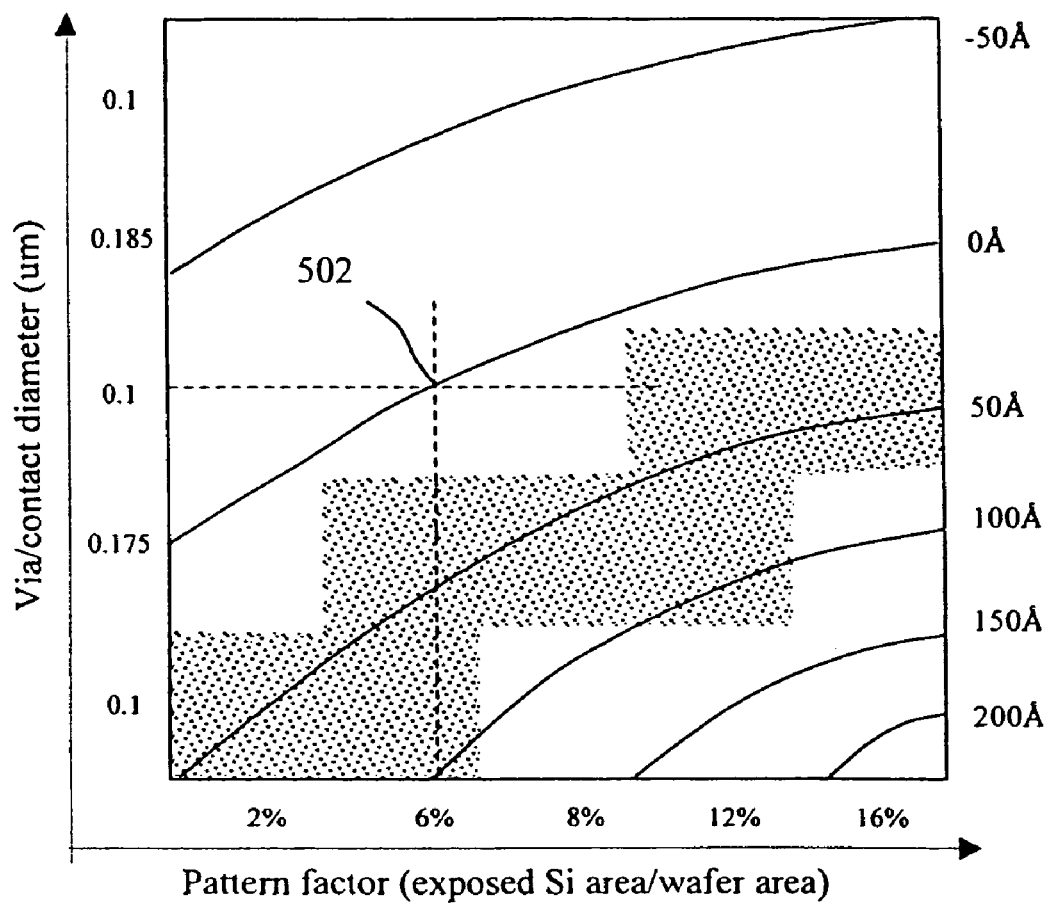

At a given primary beam energy and current, the VC transition happens within a narrow under-etch region with the thicknesses of remainders varying around the primary beam determined threshold thickness. In other words, the thickness of remainders of a via/contact can be determined from its corresponding transition image at known beam conditions. For instance, if the primary electron beam is of 400 eV in energy and 60 nA in current, the transition region 401 represents that an equi-thickness region of about 50 Å remained within via/contacts. Further calibration can turn this roughly equi-thickness region into equi-thickness line 402, as shown in FIG. 4, with the x-coordinate representing pattern factor, and the y-coordinate representing the via/contact sizes. Other curves approximately conformal to this line exten the equi-thickness line to the nearby over-etch and under-etch regions. By doing so, a process "fingerprint" image is quantified with the amount of under/over etch with reference to the just-etch. For a given via/contact design rule in the functional die region, it is always possible to locate its position in this quantified "fingerprint" image and find its corresponding amount of over-etch thickness. With the aid of the quantified "fingerprint" image, manual or Automatic Process Control (APC) can be made simple by controlling the percentage of over-etch time so that the amount of over-etch is tightly controlled not far away from just-etch. For example, for 0.18 μm via/contacts in the functional dies with a pattern factor of 2%, one can easily locate its corresponding position 403 in the fingerprint image of FIG. 4. The average thickness of over-etch is found to be around 50 Å, which is within the acceptable range. If wafer-to-wafer dielectric layer thickness variation or process shifting results in a change of fingerprint image, as shown in FIG. 5A, excessive over-etching up to 90 Å is recognized, refering to 501. APC should be acknowledged, for instance, to reduce the over-etching time by a certain percentage, or to increase the etching selectivity properly. If the fingerprint image shifts in the opposite direction as shown in FIG. 5B, the via/contact holes are most probably under-etched or insufficiently over-etched, refering to 502. Both cases may incur a high contact resistance thus are beyond the process window. APC should respond to this variation with longer over-etching time. The practical ways and parameters for the process adjustment in response to the process shifting and wafer-to-wafer variations depend on the device details under processing and vary from system-to-system and fab-to-fab. However, should the process parameters shift beyond the tolerance, or the dielectric layer thickness variation exceed the process window, the fingerprint image will immediately reveal this abnormality, and provide guidelines for the consequent control. This inline APC considerably reduces the final electrical failure rate and accelerates the yield ramp for new products. Also, by doing so, the presently required over-etch time when etching contact holes can be reduced significantly, for instance by 10% or higher.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalent, and alternatives falling within the spirit and scope of the invention as defined by the appended claims.

What is claimed is:

1. A device for characterizing an etching process, the device comprising:
    an array of via regions formed by at least an etching process;
    wherein the array of via regions includes:
    a first via region associated with a first common via size and a first common via density;
    a second via region associated with a second common via size and a second common via density;
    a third via region associated with a third common via size and a third common via density;
    a fourth via region associated with a fourth common via size and a fourth common via density;
    wherein:
    the first common via density is smaller than the second common via density;
    the first common via density is equal to the third common via density;
    the third common via density is smaller than the fourth common via density;
    the second common via density is equal to the fourth common via density;
    wherein:
    the first common via size is equal to the second common via size;
    the first common via size is smaller than the third common via size;
    the third common via size is equal to the fourth common via size;
    the second common via size is smaller than the fourth common via size.

2. The apparatus of claim 1 wherein the etching process is a single etching process to a first layer.

3. The apparatus of claim 2 wherein:
    the array of via regions is located on a wafer;
    the wafer includes at least a via outside the array of via regions;
    the via is formed by performing the etching process to a second layer;
    the first layer and the second layer are associated with a substantially same thickness and a substantially same composition.

4. The apparatus of claim 2 wherein the first layer is a dielectric layer.

5. The apparatus of claim 1 wherein:
    the first via region is adjacent to the second via region;
    the first via region is adjacent to the third via region;
    the fourth via region is adjacent to the third via region;
    the fourth via region is adjacent to the second via region.

* * * * *